(12) United States Patent
Prechtl

(10) Patent No.: US 9,356,118 B2
(45) Date of Patent: May 31, 2016

(54) METALIZATION OF A FIELD EFFECT POWER TRANSISTOR

(71) Applicant: Infineon Technologies Austria AG, Villach (AT)

(72) Inventor: Gerhard Prechtl, Rosegg (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/857,084

(22) Filed: Sep. 17, 2015

(65) Prior Publication Data
US 2016/0087074 A1   Mar. 24, 2016

(30) Foreign Application Priority Data

Sep. 18, 2014 (DE) .......................... 10 2014 113 467

(51) Int. Cl.
| | | |
|---|---|---|
| H01L 29/739 | (2006.01) | |
| H01L 29/66 | (2006.01) | |
| H01L 21/768 | (2006.01) | |
| H01L 29/40 | (2006.01) | |
| H01L 23/532 | (2006.01) | |
| H01L 29/205 | (2006.01) | |
| H01L 29/20 | (2006.01) | |
| H01L 23/528 | (2006.01) | |
| H01L 21/3205 | (2006.01) | |

(52) U.S. Cl.
CPC .... *H01L 29/66462* (2013.01); *H01L 21/32051* (2013.01); *H01L 21/76895* (2013.01); *H01L 23/528* (2013.01); *H01L 23/53219* (2013.01); *H01L 23/53223* (2013.01); *H01L 23/53233* (2013.01); *H01L 23/53238* (2013.01); *H01L 29/2003* (2013.01); *H01L 29/205* (2013.01); *H01L 29/402* (2013.01)

(58) Field of Classification Search
CPC ................... H01L 23/53238; H01L 23/53233; H01L 23/53223; H01L 29/205; H01L 29/402; H01L 29/66431; H01L 29/66462; H01L 29/778; H01L 29/7781; H01L 29/7782; H01L 29/7783; H01L 29/7784; H01L 29/7785; H01L 29/7786
USPC ......................................................... 257/194
See application file for complete search history.

(56) References Cited

U.S. PATENT DOCUMENTS

| | | | |
|---|---|---|---|
| 7,550,821 B2 | 6/2009 | Shibata et al. | |
| 2005/0139891 A1* | 6/2005 | Beach | .................. H01L 29/0692 257/306 |

(Continued)

FOREIGN PATENT DOCUMENTS

| | | |
|---|---|---|
| JP | 02102546 A | 4/1990 |
| JP | 2602360 B2 | 4/1997 |

*Primary Examiner* — Thanh T Nguyen
(74) *Attorney, Agent, or Firm* — Murphy, Bilak & Homiller, PLLC

(57) ABSTRACT

A metalization of a field effect power transistor having lateral semiconductor layers on an insulator substrate or an intrinsically conducting semiconductor substrate is described. The lateral semiconductor layers have different band gaps such that a two-dimensional electron gas can form in their semiconductor depletion layer. Upon application of a voltage between source electrode contact areas and drain electrode contact areas or source and drain, an electric current can flow through the lateral semiconductor depletion layer. Current intensity in a channel region between the source electrode contact areas and the drain electrode contact areas is controllable via gate electrode contact areas by means of a gate voltage.

20 Claims, 5 Drawing Sheets

(56) References Cited

U.S. PATENT DOCUMENTS

2008/0185174 A1* 8/2008 Bedinger ............ H01L 23/3192
            174/260

2011/0140174 A1* 6/2011 Kaneko ................ H01L 29/475
            257/194
2012/0012945 A1   1/2012 Inoue
2012/0138956 A1* 6/2012 Shimizu ............ H01L 21/02458
            257/77

* cited by examiner

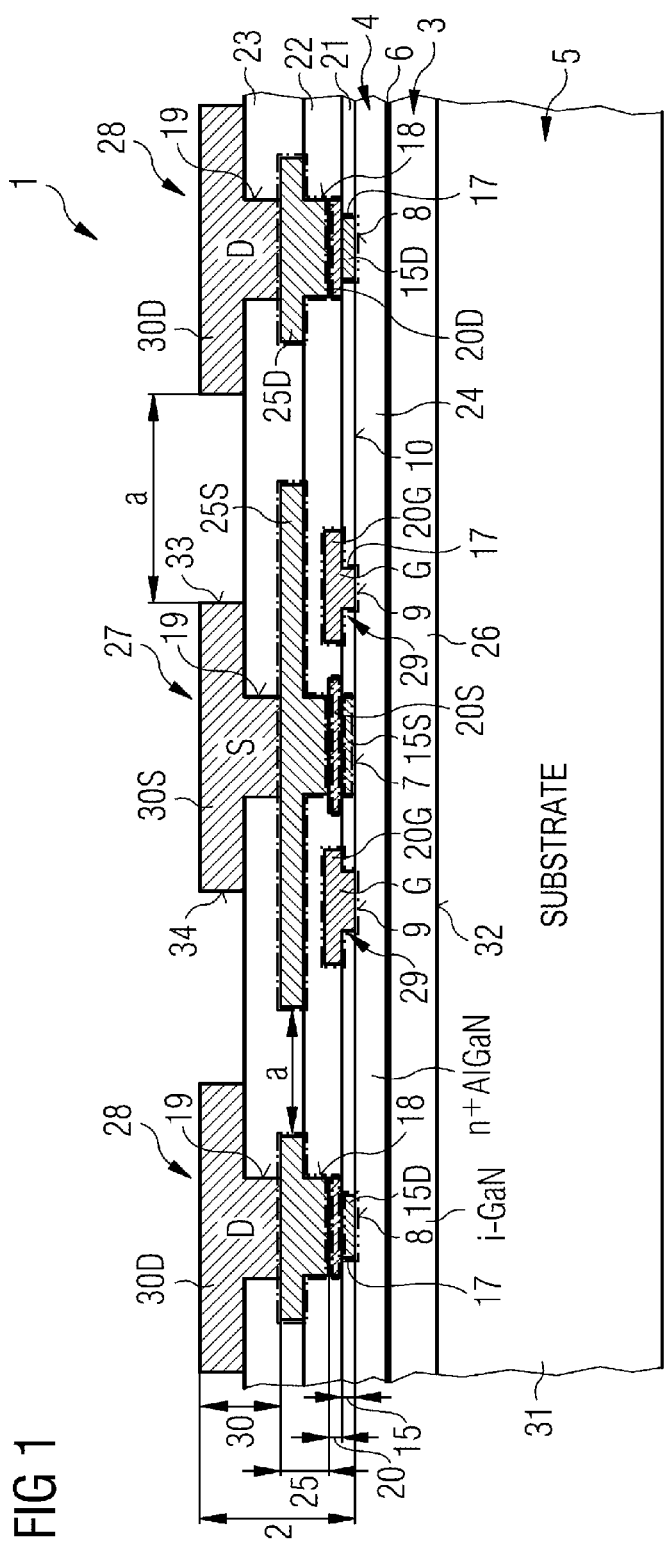

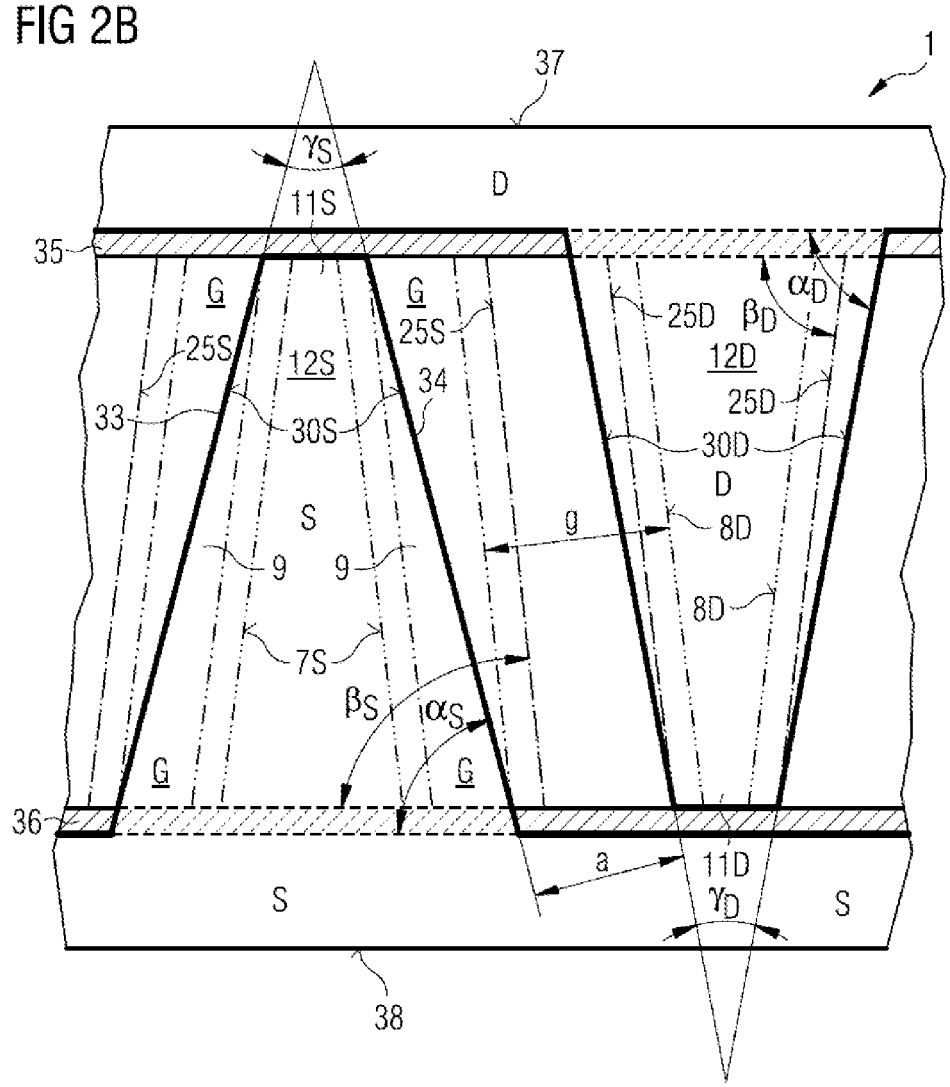

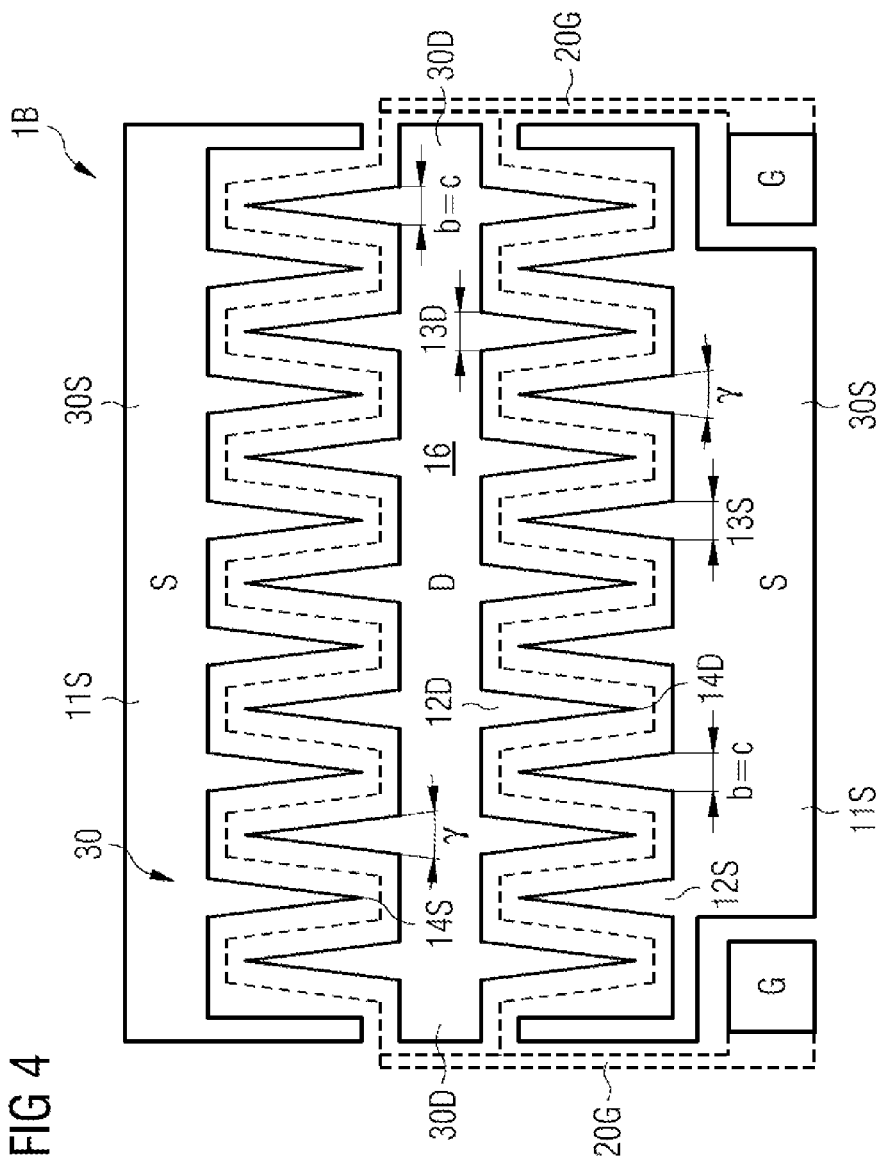

METALIZATION OF A FIELD EFFECT POWER TRANSISTOR

PRIORITY CLAIM

This application claims priority to German Patent Application No. 10 2014 113 467.2 filed on 18 Sep. 2014, the content of the application incorporated herein by reference in its entirety.

TECHNICAL FIELD

The application relates to a metalization of a field effect power transistor on the basis of lateral semiconductor layers on an insulator substrate or an intrinsically conducting semiconductor substrate.

BACKGROUND

Lateral semiconductor layers have different band gaps in such a way that a two-dimensional electron gas can form in their semiconductor depletion layer, wherein between source electrode contact areas and drain electrode contact areas a current can flow upon application of a voltage between a source metalization and a drain metalization through the lateral semiconductor depletion layer on account of the two-dimensional electron gas. The current intensity in a channel region between the source electrode contact areas and the drain electrode contact areas can be controlled via gate electrode contact areas by means of a gate voltage and the manifested field effect.

Multilayered metalizations are applied on the source electrode contact areas, the drain electrode contact areas and the gate electrode contact areas, wherein a topmost power metalization is required only on the source electrode contact areas and the drain electrode contact areas, which, however, are spaced apart from one another and intermesh in a toothed fashion without the teeth touching one another. The intermeshing teeth spaced apart from one another are also called contact fingers and have a rectangular contour in conventional field effect power transistors, wherein strip-shaped metalizations of the gate electrode contact areas are arranged below the metalization of the source electrode contact areas and in a manner insulated from the latter by an insulation layer.

Such a metalization having rectangular contact fingers or teeth is known from the document U.S. Pat. No. 7,550,821 B2. One disadvantage of the elongated contact fingers is that the current density decreases from the contact finger foot to the contact finger tip, such that the width in the region of the contact finger foot limits the maximum current density of the metalization of the source electrode contact areas and of the drain electrode contact areas, while the width of the rectangular contact finger tip is overdimensioned.

SUMMARY

Embodiments described herein provide a metalization of a field effect power transistor which utilizes the surface of a semiconductor chip in such a way that a power metalization right into the contact finger tips of the metalization of source and drain permits an improved current density distribution whilst avoiding electromigrations.

One embodiment comprises a metalization of a field effect power transistor on the basis of lateral semiconductor layers on an insulator substrate or an intrinsically conducting semiconductor substrate. The lateral semiconductor layers have different band gaps in such a way that a two-dimensional electron gas can form in their semiconductor depletion layer. Upon application of a voltage between source electrode contact areas and drain electrode contact areas or between source and drain, an electric current can flow through the lateral semiconductor depletion layer. The current intensity in a channel region between the source electrode contact areas and the drain electrode contact areas can be controlled via gate electrode contact areas by means of a gate voltage.

The metalization of the source electrode contact areas, of the drain electrode contact areas and of the gate electrode contact areas on a semiconductor surface of the semiconductor layers has a plurality of metalization layers, between which insulation layers are arranged in a lateral direction. The metalization layers both for a source electrode metalization and for a drain electrode metalization have a comb structure having contact fingers. The contact fingers of the source electrode metalization and of the drain electrode metalization intermesh in a spaced-apart fashion. Each contact finger has a contact finger foot and a contact finger tip. In this case, a width of the contact finger foot is greater than a width of the contact finger tip.

One advantage of this metalization of a field effect power transistor resides in multilayered metalization layers which can be optimized to the effect that a corrosion-resistant material is used as outermost power metalization layer, while for metalization layers that are arranged underneath and are protected from the environment, such as a field plate metalization, for example, metal alloys can be used which have an optimum electrical conductivity and minimal contact resistances from metal layer to metal layer, without a dedicated corrosion protection having to be provided. Furthermore, it is possible to provide metalization materials for an optimum transition with respect to the semiconductor layers, without possible reactions with the external environment of the field effect power transistor having to be taken into account.

A further advantage resides in the geometry of the comb structure provided here for the metalization of the source electrode contact areas, of the drain electrode contact areas and also of the gate electrode contact areas. By virtue of the fact that all metalization layers are adapted to the structure and contour of the source electrode contact areas and of the drain electrode contact areas, in which the width of the contact finger foot is greater than the width of the contact finger tip, and a parallel routing of metalizations on the semiconductor layers in the form of conventional comb structures running parallel is dispensed with, it can additionally be ensured that electromigrations between the individual metal contact layers are avoided.

Furthermore, as a result of the tapering contact fingers having a width of a plurality of micrometers in the region of contact feet and a width that continuously decreases in the direction of the contact finger tip, the current loading of the metalization can be made more uniform. In addition, the required area as a result of the introduction of the small angle $\gamma$ remains virtually unchanged in comparison with the conventional rectangular finger design of a conventional comb structure. If the transistor structure is limited by the power metal design rules, an area-neutral transistor can even be realized by variation of the contact area size.

In one embodiment, the width of the contact fingers in the region of the contact finger tip tends toward zero, wherein the contact fingers of the source electrode metalization and of the drain electrode metalization have an equilateral triangle having an acute angle $\gamma$ of between $0° \leq \gamma \leq 3°$, preferably between $0.1° \leq \gamma \leq 1.5°$, particularly preferably between $0.1° \leq \gamma \leq 0.5°$ relative to the base. For this purpose, the contact finger foot is regarded as the base. The extremely acute angle in the region of the contact finger tip enables an elongated slender structure for the intermeshing contact fingers of the comb structure.

In this case, the base can correspond to a base width c of between 30 µm≤c≤40 µm, preferably c=36 µm. For this purpose, source electrode metalization and drain electrode metalization can be arranged in such a way that a contact finger tip of a triangular contact finger of the drain electrode metalization is arranged in the region of the contact feet of two triangular contact fingers of the source electrode metalization, and vice versa.

In a further embodiment, it is provided that the plurality of metalization layers have firstly a first selective contact layer on the semiconductor surface in corresponding first contact window openings for source, drain and gate of a first insulation layer. A further so-called ohmic contact layer is arranged on the first contact layer. While for the first selective contact area through the contact windows in the first insulation layer are selectively structured, the ohmic contact layer can firstly be deposited over the whole area on the first insulation layer and subsequently be selectively structured in order to provide an ohmic contact layer geometrically adapted to the first contact layer. Such an ohmic contact layer is provided with a material having a high electrical conductivity and a minimal contact resistance with respect to the first selective contact layer arranged underneath.

An ohmic contact metalization and a gate electrode metalization are used. The gate electrode metalization only has to be able to carry the charge reversal currents, which can be realized without power metalization. Further metalization layers are required for the power-carrying drain electrode metalization and the source electrode metalization.

On the respective ohmic contact layers of the source electrode metalization and of the drain electrode metalization, in corresponding second contact window openings of a second insulation layer, a field plate metalization layer is provided which extends areally on the second insulation layer and covers a multiple of the area of the second contact window openings of the second insulation layer.

While the second contact window openings do not differ significantly from the first contact window openings of the first insulation layer in terms of their areal size, in particular the field plate metalization layer of the source electrode metalization projects beyond the second contact windows in such a way that the field plate metalization layer of the source electrode metalization completely overlaps the gate electrode metalization.

This has the advantage that the high electric fields at the gate edge in the direction of the drain side are greatly reduced. The requirements made of the component in respect of lifetime and in respect of reliability can be ensured by the incorporation of this field plate. The field plate metalization layer is preferably constructed from a copper alloy. In order to optimize this shielding effect, preferably the field plate metalization layer is constructed from a copper alloy.

Despite its enlarged areal extent, the field plate metalization layer of the source electrode metalization is spaced apart uniformly from the field plate metalization layer of the drain electrode metalization and arranged in a manner areally interlocked with respect to one another in accordance with the structure of the source electrode contact areas and drain electrode contact areas. For this purpose, it is necessary to comply with a minimum distance which ensures that the electric fields between the source and drain metalizations do not become excessively high, in order to be able to ensure the lifetime and reliability requirements of this electrical component. If the distances are chosen to be too small, flashovers or breakdowns/short circuits in the insulation layers used can already result within the required lifetime.

In a further embodiment, the plurality of metalization layers of the source electrode metalization and of the drain electrode metalization have on the respective field plate metalization layer in corresponding third contact window openings of a third insulation layer a power metalization layer of the source electrode contact areas and drain electrode contact areas which extends areally over the third insulation layer and covers a multiple of the area of the third contact window openings of the third insulation layer.

Additionally for the power metalization layer of the source electrode metalization and of the drain electrode metalization, firstly the third contact window opening corresponds to the second and first contact window openings in terms of its areal size, such that the first, the second and the third contact window openings of the source electrode metalization and of the drain electrode metalization have comb and finger structures of identical size.

Since the power metalization has to take up the entire current that is to be switched between source and drain, these two comb structures almost completely cover the semiconductor layers apart from the predefined distance between the edges of the source electrode metalization and of the drain electrode metalization. This distance a between the power metalizations of the mutually interlocked power metalization of the source electrode contact areas and of the drain electrode contact areas in accordance with their voltage class with 150 V/µm is between preferably 1 µm≤a≤10 µm and particularly preferably between 1 µm≤a≤6 µm.

In a further embodiment, it is provided that the power metalization of the drain electrode contact areas projects beyond the edges of the triangular contact fingers of the mutually interlocked field plate metalization for the drain electrode contact areas, while the field plate metalization of the source electrode contact areas projects beyond the edges of the power metalization for the source electrode contact areas. This difference supports the reduction of the electric fields by the field plate metalization of the source electrode contact areas for the gate electrode contact areas, since the field plate metalization covers the gate electrode contact areas arranged on both sides of the source electrode metalization and is electrically insulated from them by the second insulation layer.

What is crucial for an effective function of the field effect power transistor is that the power metalization of the drain electrode contact areas does not overlap the ohmic contact layer of the gate electrode contact areas and has a minimum distance d with respect to the gate electrode contact areas in accordance with its voltage class with 150 V/µm, preferably between 1 µm≤d≤30 µm, particularly preferably between 1 µm≤d≤10 µm.

In a further embodiment, it is provided that trapezoidal fingers of the power metalization have at the finger foot a base angle α, wherein the base angle α is less than a base angle β of trapezoidal fingers of the associated field plate metalization layer. This is associated with the advantage that the available crystal surface can be utilized even more intensively.

In a further embodiment, it is provided that the power metalization of the drain electrode metalization is arranged centrally between two interlocked power metalizations of the source electrode metalization, the interlocked power metalizations being arranged in a mirror-inverted fashion with respect to one another, such that the interlocking of the power metalization of the drain electrode metalization has a fir tree structure. This fir tree structure of the power metalization of the drain electrode metalization is advantageously surrounded by the two mutually opposite comb structures of the power metalizations of the source electrode metalization, such that it is possible to place the gate electrode contact area all around the fir tree structure and thereby to ensure that upon application of a drain-source voltage or source-drain voltage the current in the two-dimensional electron layer can be controlled by the gate electrode metalization and no marginal creepage currents occur.

A further advantage is that negative edge effects such as can occur in the case of a conventional parallel comb structure are thus avoided because the fir tree structure with the power metalization of the drain electrode metalization is practically enclosed by the gate electrode metalization, while in alternative comb structures the gate electrode metalization ends toward both edge sides.

Provision is made for using the metalization of the field effect power transistor for an HEM transistor ("high electron mobility" transistor) or for an MODFE transistor ("Modulation-doped field-effect" transistor) or a TEGFE transistor ("two dimensional electron-gas field-effect" transistor) or an SDH transistor ("selectively doped heterojunction" transistor) or an HFE transistor ("heterojunction field-effect" transistor). For this purpose, one of the following semiconductor material systems is used for the lateral semiconductor layers having different band gaps: AlGaAs/GaAs, AlInN/GaN, AlGaN/GaN, Si/SiGe, InGaAs/InP/AlInAs.

In a further embodiment, the field effect power transistor is an HEM transistor having an aluminum gallium nitride layer (AlGaN) as topmost junction semiconductor layer with respect to the first metallic contact layer of the source electrode contact areas, of the drain electrode contact areas and of the gate electrode contact areas, wherein, for forming a two-dimensional electron gas layer, the aluminum gallium nitride layer is arranged on an intrinsically conducting, undoped gallium nitride layer.

Furthermore, it is provided that the semiconductor layers having their different band gaps are arranged on an undoped or doped silicon carbide substrate or a sapphire substrate as insulation substrate. Alternatively, a doped Si wafer can also serve as substrate.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1 shows a schematic cross section through a metalization of an HEMT power transistor (high electron mobility transistor) as field effect power transistor 1 along a sectional line A-A in accordance with FIG. 2.

FIG. 2B shows a schematic plan view of the metalization of the HEMT power transistor with different base angles of the triangular metalization fingers.

FIG. 4 shows a schematic plan view of a power metalization of a field effect power transistor 1B in accordance with a further embodiment.

DETAILED DESCRIPTION

Figure 2A:
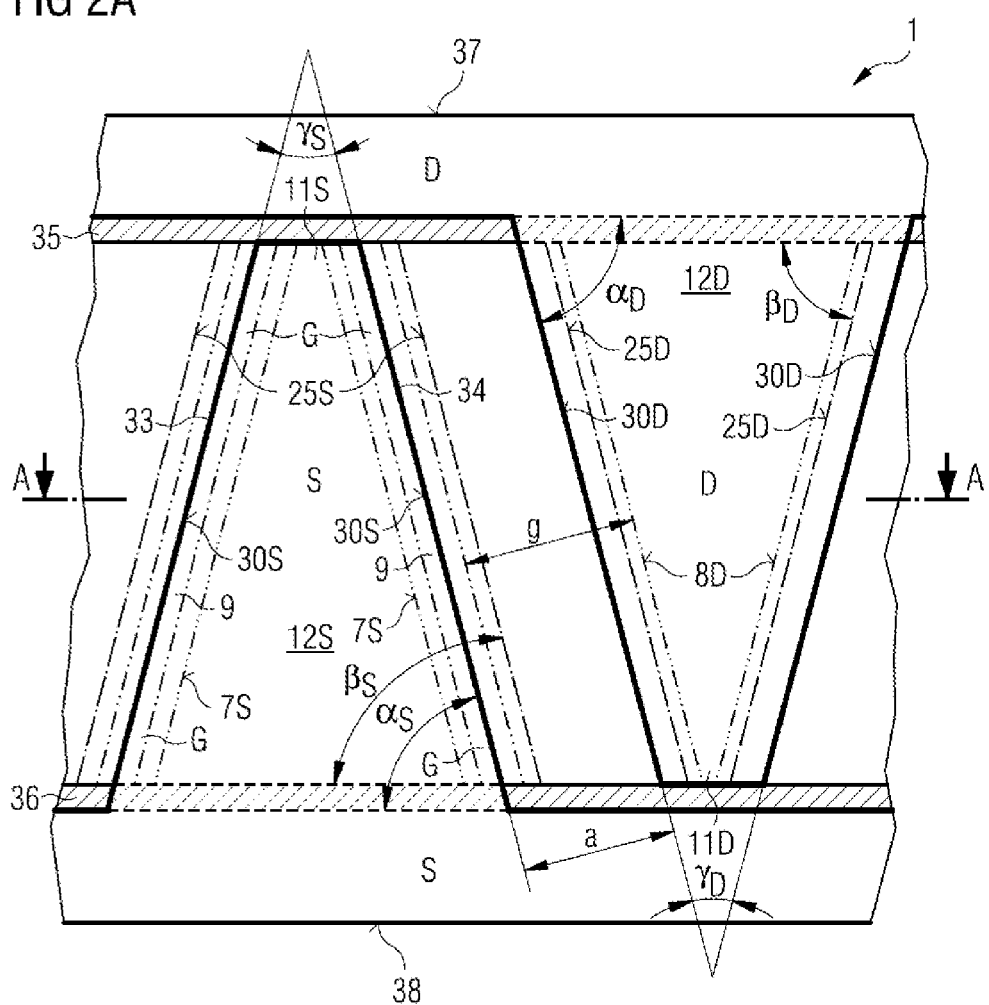
FIG. 2A shows a schematic plan view of the metalization of the HEMT power transistor with base angles having identical magnitudes of the triangular metalization fingers with the position of the sectional plane A-A for the cross-sectional view of FIG. 1.

FIG. 1 shows a schematic cross section through a metalization 2 of an HEMT power transistor (high electron mobility transistor) as field effect power transistor 1 along a sectional line A-A in accordance with FIG. 2. In the embodiment shown, this field effect power transistor 1 has an insulating substrate 5 composed of sapphire 31. Semiconductor layers 3 and 4 are arranged on the top side 32 of the substrate 5, wherein in this embodiment the semiconductor layer 3 consists of an intrinsically conducting gallium nitride (i-GaN) 26, wherein the i-GaN is doped with carbon or iron ions in order to compensate for lattice defects. The i-GaN layer together with an aluminum gallium nitride layer (AlGaN) 24 arranged thereabove, forms a semiconductor depletion layer 6.

A two-dimensional electron gas layer forms in the semiconductor depletion layer 6, wherein, on account of the high mobility of the electrons in the two-dimensional electron gas layer, HEMT transistors are suitable for very high frequencies into the gigahertz range. Upon application of a voltage between a source electrode S and drain electrodes D, with the aid of a gate electrode metalization 29 with a high-frequency gate voltage being applied, the current between the source electrodes S and the drain electrodes D in the two-dimensional electron gas layer can be modulated and controlled at high frequency.

For this purpose, the field effect power transistor 1 has the multilayered metalization 2, which, as shown in FIG. 1, in this embodiment, consists of four metalization layers 15, 20, 25 and 30, which are laterally and selectively isolated by three insulation layers 21, 22 and 23. In this case, a source electrode metalization 27 and a drain electrode metalization 28 differ from the gate electrode metalization 29 distinctly in position, thickness and lateral extent.

In order to impress the high currents into the semiconductor depletion layer 6 or into the two-dimensional electron layer between the source electrode S and the drain electrode D, a relatively thick power metalization layer 30 which has good conductivity and is corrosion-resistant toward external environmental influences is provided as outer upper power metalization layer 30 both for the source electrode metalization 27 on a source electrode contact area 7 and for the drain electrode metalization 28 on a drain electrode contact area 8.

The multilayered constructions on two drain electrode contact areas 8 and one source electrode contact area 7 as shown in FIG. 1 do not run parallel to one another, as might initially be suggested by this sectional view, rather the source electrode metalization 27 tapers into the plane of the drawing and widens or expands coming out of the plane of the drawing. By contrast, the drain electrode metalizations 28 widen into the plane of the drawing and run at an acute angle out of the plane of the drawing, as is made clear by the subsequent excerpt from a plan view.

In order to avoid flashovers and excessively high electric fields between the electrodes, it is necessary to comply with distances between the source electrode metalization 27, the drain electrode metalization 28 and the gate electrode metalization 29. Correspondingly, the gate electrode metalization 29 also does not run parallel to the edges of the substrate 5, but rather below and along the edges 33 and 34 of the power metalization 30 of the source electrode metalization 27. In order to maintain the field effect function between the source electrode contact area 7 and the drain electrode contact area 8, a gate electrode contact area 9 on both sides of the source electrode contact area surrounds the latter as far as the tip (not visible) of the source electrode contact area 7 below the plane of the drawing.

Gate electrode contact areas 9 only have a structured ohmic contact layer 20 G.

The multilayered metalization 2 has two layers for the source electrode metalization 27 and drain electrode metalization 28, namely a first contact layer 15S and 15D, respectively, in first contact window openings 17 and an ohmic contact layer 20S and 20D, respectively, which is arranged on the first contact layer 15S and 15D, respectively, in order to reduce the contact resistance. The ohmic contact layer 20S and 20D, respectively, projects beyond the first contact layer 15S and 15D, respectively, only slightly.

For the source electrode metalization 27 and drain electrode metalization 28, there is adjacent to the ohmic contact layer 20S and 20D a significantly enlarged metalization in the form of a field plate metalization layer 25S for the source electrode metalization 27 and 25D for the drain electrode metalization 28. Finally, the upper termination is formed by a power metalization layer 30S and 30D, respectively.

The source electrode metalization 27 differs from the drain electrode metalization 28 in the field plate metalization layer 25. The field plate metalization layer 25S of the source electrode contact area 7, which is arranged in a second contact window opening 18 of a second insulation layer 22 and widens on the second insulation layer 22 by a multiple in comparison with the field plate metalization layer 25D of the drain electrode metalization 28.

The field plate metalization layer 25D of the drain electrode metalization 28 is widened only slightly in comparison with second contact window openings 18 on the second insulation layer 22. The field plate metalization layer 25S of the source electrode metalization 27 widens on the second insulation layer 22 in such a way that it covers the gate electrode metalization 29 on both sides and greatly reduces the high electric fields at the gate edge in the direction of the drain side and thus shields against electric interference fields. In order to improve the shielding effect further, the field plate metalization layer 25 in this embodiment comprises a copper alloy, which, however, as is known, is sensitive to surface oxidation and corrosion. However, the field plate metalization layer 25 is protected and covered to the greatest possible extent by a third insulation layer 23, in the form of an oxide layer.

Arranged in the third insulation layer 23 are contact window openings 19 via which the power metalization 30 contacts the field plate metalization layer 25 both in the region of the source electrode metalization 27 and in the region of the drain electrode metalization 28. At the same time the power metalization layer 30 widens on the third insulation layer 23 whilst complying with the minimum distance a of here 6 μm, for example in order to ensure the dielectric strength between source electrode S and drain electrode D. As material for the power metalization layer, in this embodiment use is made of an aluminum alloy, which forms a protective aluminum oxide skin ($Al_2O_3$) under ambient conditions and thus becomes corrosion-resistant.

The distance a of 6 μm, for example, is also complied with between the field plate metalization layer 25S of the source electrode metalization 27 and the field plate metalization layer 25D of the drain electrode metalization 28.

FIG. 2A shows a schematic plan view of the metalization 2 of the HEMT power transistor with the position of a sectional plane A-A for the cross-sectional view of FIG. 1. This plan view is only a partial view of a comb structure 11S of the source electrode S and of a comb structure 11D of the drain electrode D, which intermesh by way of their triangular contact fingers 12S and 12D, respectively, whilst complying with a distance a of approximately 6 μm. In this case, the solid lines show the contour of the power metalization layer 30D for the drain electrode D and 30S for the source electrode S.

The dash-dotted lines mark the boundaries of the field plate metalization layer arranged underneath with 25S for the source electrode S and 25D for the drain electrode D. In FIG. 2, the electrode contact areas for the gate electrode G are marked by double-dot-dashed lines. Furthermore, the electrode contact areas both for the source electrode S and for the drain electrode D are marked by triple-dot-dashed lines, such that the contours of the source electrode contact area 7S, of the drain electrode contact area 8D and of the drain electrodes D which contact the semiconductor surface are clearly visible.

The acute angle γ at which the contact fingers 12S of the source electrode S and 12D of the drain electrode D taper toward their tips is illustrated in an extremely enlarged fashion in this basic illustration, in order to be able to better clarify the assignment of the different metalization layers. The contact fingers 12S and 12D are significantly more slender by comparison therewith, such that the acute angle γ is formed only in the range of between $0° \leq \gamma \leq 3°$, preferably between $0.1° \leq \gamma \leq 1.5°$, particularly preferably between $0.1° \leq \gamma \leq 0.5°$, relative to a base. Furthermore, FIG. 2A shows that an insulation strip 35 and 36, respectively, is arranged below the power metalization in each case in the transition with respect to the contact fingers 12S and 12D of the HEMT structure, the insulation strip electrically isolating the tips of the contact fingers 12S and 12D, with the result that a trapezoidal geometry of the contact fingers forms. Such insulation strips 35 and 36 can extend as far as the respective semiconductor chip edge 37 and 38 below the source electrode S and below the drain electrode D, respectively.

The trapezoidal fingers of the power metalization 30S and 30D have at the finger foot a base angle $\alpha_S$ and $\alpha_D$, respectively. The trapezoidal fingers of the field plate metalization layer 25S and 25D have the base angle $\beta_S$ and $\beta_D$, respectively, wherein the base angles $\alpha_S$ and $\alpha_D$ are equal in magnitude in the embodiment shown in FIG. 2A. The angles $\alpha_S$ and $\beta_S$ also correspond to one another and are equal in magnitude. The angles $\alpha_D$ and $\beta_D$ are likewise equal in magnitude.

In order that the available crystal surface is utilized even better, FIG. 2B shows a schematic plan view of the metalization of the HEMT power transistor with different base angles $\alpha_S$ and $\alpha_D$ of the trapezoidal fingers of the power metalization 30S and 30D. Furthermore, the base angle $\alpha_S$ of the source contact fingers can be not equal to the base angle $\beta_S$ of trapezoidal fingers of the source field plate metalization layer 25S. Likewise, the base angle $\alpha_D$ of the drain contact fingers can be not equal to the base angle $\beta_D$ of trapezoidal fingers of the drain field plate metalization layer 25D. Nevertheless, the predefined distance g for a sufficient dielectric strength between the edge of the gate electrode contact area 9 and the edge of the drain electrode contact area 8D can be maintained. The meanings of the further reference signs and of the dash-dotted lines and also of the functions thereof correspond to those in FIG. 2A.

Figure 3:
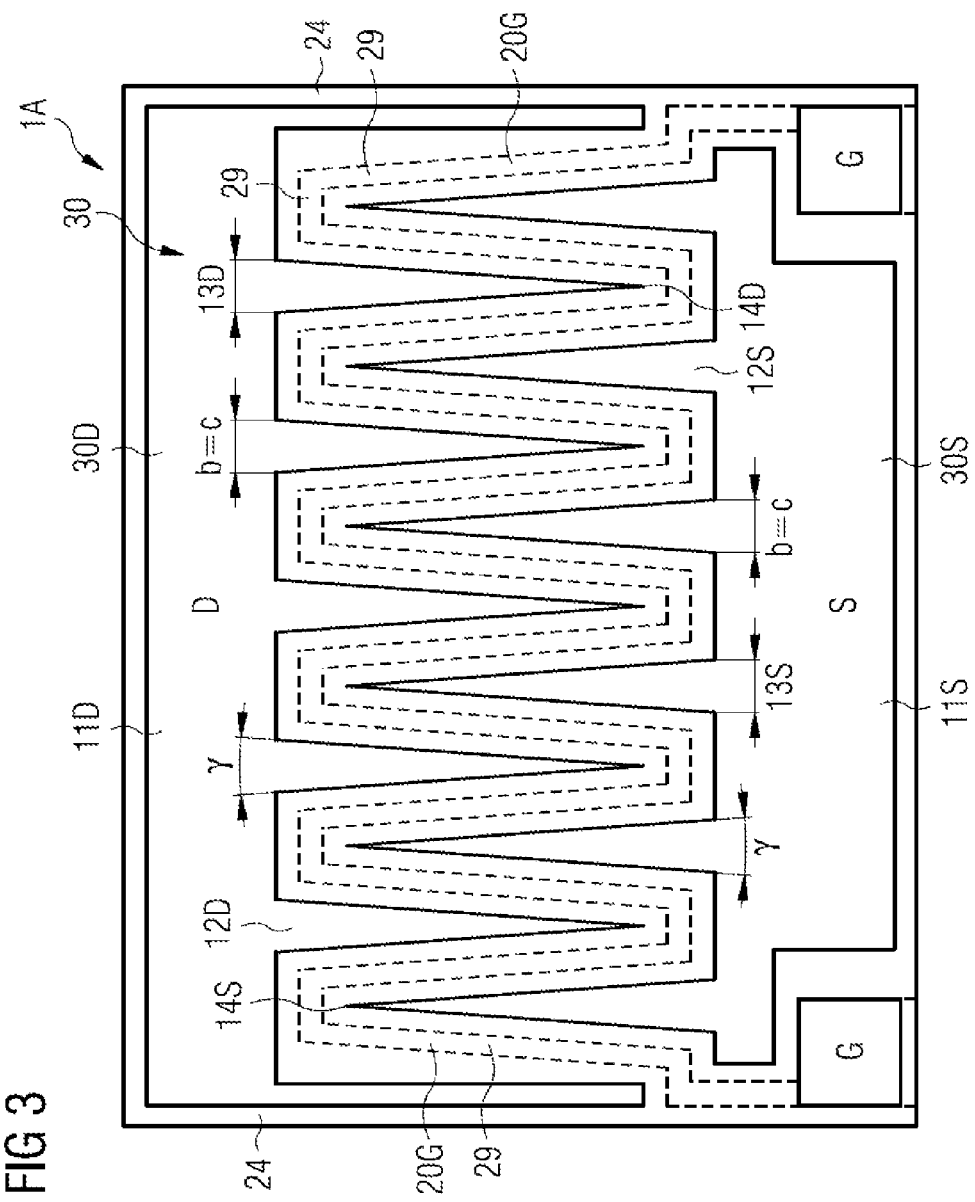
FIG. 3 shows a schematic plan view of a power metalization of a field effect power transistor 1A in accordance with a different embodiment.

FIG. 3 shows a schematic plan view of a power metalization 30 of a field effect power transistor 1A in accordance with a different embodiment. FIG. 3 merely shows the principle of a comb structure 11 both for the power metalization 30D of the drain electrode D with the comb structure 11D and for the power metalization 30S of the source electrode S with the comb structure 11S. The comb structure 11D forms tapering contact fingers 12D, which in their contact finger foot 13D have a width b corresponding to the base width c of an isosceles triangle forming the outer contour of the contact fingers 12D, wherein the tip can also be rounded.

In this embodiment, width b is 32 μm, wherein the angle γ is in the range of values already mentioned above and runs from the contact finger foot 13D to the contact finger tip 14D. A contact finger tip 14S of the comb structure 11S of the source electrode S is in each case arranged between two foot regions 13D here. The gate electrode metalization 29, which is arranged on the semiconductor surface, consisting of the AlGaN layer 24, is merely indicated by a dashed line in FIG. 3 and exhibits the ohmic contact layer 20G. However, as mentioned above, the ohmic contact layer 20G is overlapped or covered by the field plate metalization 25S (not shown here) of the source electrode metalization 27 in order to reduce the electric fields at the gate edge in the direction of the drain.

In this embodiment in accordance with FIG. 3, the gate electrode metalization ends on the two opposite edges and in this case surrounds the comb structure 11S of the source electrode S in a meandering fashion.

FIG. 4 shows a schematic plan view of a power metalization 30 of a field effect power transistor 1B in accordance with a further embodiment. Components having functions identical to those in the previous figures are identified by identical reference signs and are not explained in more specific detail.

The difference between the further embodiment of the field effect power transistor 1B and the previous embodiments of the field effect power transistor 1A in accordance with FIG. 3 is that the drain electrode D is now arranged centrally on the semiconductor chip and is framed by two comb structures 11S of the source electrode. Consequently, the drain electrode D exhibits a fir tree structure 16 for its power metalization 30D and is enclosed or surrounded by a closed gate electrode G, such that the otherwise customary edge effects for the beginning and the end of the gate electrode are omitted in this embodiment.

Consequently, the efficiency and the security of this HEMT power transistor, as already mentioned in the introduction, can be improved by the triangular structure of the contact fingers contrary to the parallel structure and the current density between the contact fingers 12S and 12D from the contact finger feet 13D and 13S to the contact finger tips 14S and 14D can be made more uniform.

Furthermore, more contact fingers can be accommodated on the same semiconductor area, which means that the maximally controllable current per semiconductor chip area can be increased since the channel width widens.

Although at least one exemplary embodiment has been shown in the description above, various changes and modifications can be made. The embodiments mentioned are merely examples and are not intended to restrict the scope of validity, applicability or configuration in any way. Rather, the description above provides the person skilled in the art with a plan for implementing at least one exemplary embodiment, wherein numerous changes can be made to the function and the arrangement of elements described in an exemplary embodiment, without departing from the scope of protection of the appended claims and their legal equivalents.

What is claimed is:

1. A metalization of a field effect power transistor having lateral semiconductor layers on an insulator substrate or an intrinsically conducting or doped semiconductor substrate, wherein the lateral semiconductor layers have different band gaps such that a two-dimensional electron gas can form in a semiconductor depletion layer of each lateral semiconductor layer, wherein the two-dimensional electron gas can flow between source electrode contact areas and drain electrode contact areas upon application of a voltage between source and drain through the lateral semiconductor depletion layers, wherein current intensity in a channel region between the source electrode contact areas and the drain electrode contact areas is controllable via gate electrode contact areas by means of a gate voltage, wherein a metalization of the source electrode contact areas, a metalization of the drain electrode contact areas and a metalization of the gate electrode contact areas are on a semiconductor surface of the semiconductor layers and have a plurality of metalization layers, between which insulation layers are arranged in a lateral direction, wherein the metalization layers both for the source electrode metalization and for the drain electrode metalization have a comb structure with contact fingers, wherein the contact fingers of the source electrode metalization and of the drain electrode metalization intermesh in a spaced-apart fashion and each contact finger has a contact finger foot and a contact finger tip, wherein a width of the contact finger foot is greater than a width of the contact finger tip.

2. The metalization of claim 1, wherein the width at the contact finger tip approaches zero.

3. The metalization of claim 1, wherein the contact fingers of the source electrode metalization and of the drain electrode metalization form equilateral triangle having an acute angle γ of between $0° \leq \gamma \leq 3$ relative to a base of the equilateral triangle.

4. The metallization of claim 3, wherein the base has a base width c of between $30 \ \mu m \leq c \leq 40 \ \mu m$, preferably $c=36 \ \mu m$.

5. The metalization of claim 1, wherein a contact finger tip of a triangular contact finger of the drain electrode metalization is arranged in the region of the contact finger feet of two triangular contact fingers of the source electrode metalization.

6. The metalization of claim 1, wherein the plurality of metalization layers comprises a first selective contact layer on the semiconductor surface in corresponding first contact window openings for the source, drain and gate of a first insulation layer and a selective ohmic contact layer arranged on the selective first contact layer.

7. The metalization of claim 6, wherein the plurality of metalization layers of the source electrode metalization and of the drain electrode metalization have on the respective selective ohmic contact layers in corresponding second contact window openings of a second insulation layer a field plate metalization layer which extends areally on the second insulation layer and covers a multiple of the area of the second contact window openings of the second insulation layer.

8. The metalization of claim 6, wherein the field plate metalization layer of the source electrode metalization and the field plate metalization layer of the drain electrode metalization are spaced apart from one another and are arranged in a manner areally interlocked with respect to one another in accordance with a structure of the source electrode contact areas and the drain electrode contact areas.

9. The metalization of claim 8, wherein the plurality of metalization layers of the source electrode metalization and of the drain electrode metalization have on the respective field plate metalization layer in corresponding third contact window openings of a third insulation layer a power metalization layer of the source electrode contact areas and the drain electrode contact areas which extends areally on the third insulation layer and covers a multiple of the area of the third contact window openings of the third insulation layer.

10. The metalization of claim 9, wherein the first, the second and the third contact window openings of the source electrode metalization and of the drain electrode metalization have comb and contact finger structures of identical size.

11. The metalization of claim 9, wherein the power metalization of the drain electrode contact areas beyond edges of triangular contact fingers of the mutually interlocked field plate metalization layer, and wherein the field plate metalization layer of the source electrode contact areas projects beyond edges of a power metalization and with the field plate metalization layer the gate electrode contact areas arranged on both sides of the source electrode contact areas are covered and are electrically insulated therefrom by the second insulation layer.

12. The metalization of claim 7, wherein the field plate metalization layer of the mutually interlocked source electrode contact areas and of the drain electrode contact areas comprises a copper alloy and the power metalizations of the source electrode contact areas and of the drain electrode contact areas comprise an aluminum alloy.

13. The metalization of claim 9, wherein the power metalization of the drain electrode contact areas does not overlap the ohmic contact layer of the gate electrode contact areas and has a minimum distance d with respect to the gate electrode contact areas in accordance with its voltage class with 150 V/μm.

14. The metalization of claim 9, wherein the power metalization of the drain electrode contact areas is arranged centrally between two interlocked power metalizations of the source electrode contact areas, the interlocked power metalizations being arranged in a mirror-inverted fashion with respect to one another, such that the interlocking of the power metalization of the drain electrode contact area has a fir tree structure.

15. The metalization of claim 1, wherein the lateral semiconductor layers comprise one of the following semiconductor material systems: Si/SiGe; AlGaAs/GaAs; InGaAs/InP/AlInAs; AlInN/GaN; and AlGaN/GaN.

16. The metalization of claim 9, wherein the power metalization of the mutually interlocked power metalization of the source electrode contact areas and of the power metalization of the drain electrode contact area have a distance a from one another in accordance with their voltage class of 150 V/μm and wherein 1 μm≤a≤10 μm.

17. The metalization of claim 9, wherein trapezoidal fingers of the power metalization have at the finger foot a base angle $\alpha_S$ for the source contact fingers and respectively $\alpha_D$ for the drain contact fingers, where $\alpha_S$ and $\alpha_D$ are not equal and wherein the base angle $\alpha_S$ of the source contact fingers is not equal to the base angle $\beta_S$ of trapezoidal fingers of the source field plate metalization layer and the base angle $\alpha_D$ of the drain contact fingers is not equal to the base angle $\beta_D$ of trapezoidal fingers of the drain field plate metalization layer.

18. The metalization of claim 1, wherein the field effect power transistor is an HEM transistor (high electron mobility transistor), an MODFE transistor (modulation-doped field-effect transistor), a TEGFE transistor (two dimensional electron-gas field-effect transistor), an SDH transistor (selectively doped heterojunction transistor) or an HFE transistor (heterojunction field-effect transistor).

19. The metalization of claim 1, wherein the field effect power transistor is an HEM transistor having a highly doped n-conducting aluminum gallium nitride layer as a topmost junction semiconductor layer with respect to the source electrode contact areas, the drain electrode contact areas and the gate electrode contact areas, wherein the aluminum gallium nitride layer is arranged on an intrinsically conducting, undoped, carbon- or FE-doped gallium nitride layer.

20. The metalization of claim 1, wherein the semiconductor layers are arranged on an undoped silicon carbide substrate or a sapphire substrate.

* * * * *